United States Patent
Yin et al.

(10) Patent No.: US 7,989,749 B2
(45) Date of Patent: Aug. 2, 2011

(54) METHOD AND APPARATUS PROVIDING SHARED PIXEL ARCHITECTURE

(75) Inventors: Zhiping Yin, Boise, ID (US); Xiaofeng Fan, Boise, ID (US); Jon Adams, Nampa, ID (US); Paul Perez, Meridian, ID (US); Xiangli Li, Boise, ID (US)

(73) Assignee: Aptina Imaging Corporation, George Town (KY)

( * ) Notice: Subject to any disclaimer, the term of this patent is extended or adjusted under 35 U.S.C. 154(b) by 894 days.

(21) Appl. No.: 11/905,951

(22) Filed: Oct. 5, 2007

(65) Prior Publication Data

US 2009/0090845 A1    Apr. 9, 2009

(51) Int. Cl.
*H04N 5/335* (2011.01)
*H01L 21/00* (2006.01)
*H01L 27/00* (2006.01)

(52) U.S. Cl. ............ 250/208.1; 348/308; 257/292
(58) Field of Classification Search ......... 250/208.1; 348/308; 357/292
See application file for complete search history.

(56) References Cited

U.S. PATENT DOCUMENTS

| | | | |
|---|---|---|---|
| 5,917,547 A | 6/1999 | Merrill et al. | |
| 6,252,218 B1 | 6/2001 | Chou | |
| 6,486,913 B1 | 11/2002 | Afghahi et al. | |
| 6,867,806 B1 | 3/2005 | Lee et al. | |
| 6,933,974 B2 | 8/2005 | Lee | |
| 7,244,918 B2 | 7/2007 | McKee et al. | |
| 7,244,920 B2 | 7/2007 | Kim et al. | |
| 7,443,437 B2 | 10/2008 | Altice, Jr. et al. | |
| 2002/0134917 A1 | 9/2002 | Ang | |
| 2004/0016869 A1 | 1/2004 | Campbell et al. | |
| 2004/0069930 A1 | 4/2004 | Zarnowski et al. | |
| 2004/0080643 A1 | 4/2004 | Peng | |
| 2005/0128327 A1 | 6/2005 | Bencuya et al. | |
| 2005/0164421 A1 | 7/2005 | Patrick et al. | |
| 2006/0027843 A1 | 2/2006 | Ogura et al. | |
| 2006/0038904 A1 | 2/2006 | Kudoh | |
| 2006/0044439 A1 | 3/2006 | Hiyama et al. | |
| 2006/0077273 A1 | 4/2006 | Lee et al. | |
| 2006/0118837 A1 | 6/2006 | Choi | |
| 2006/0132633 A1 | 6/2006 | Nam et al. | |
| 2006/0146158 A1 | 7/2006 | Toros et al. | |
| 2006/0164533 A1 | 7/2006 | Hsieh et al. | |
| 2006/0170804 A1 | 8/2006 | Kwon | |
| 2006/0208163 A1 | 9/2006 | Manabe et al. | |
| 2006/0231875 A1 | 10/2006 | Patrick et al. | |
| 2006/0256221 A1* | 11/2006 | Mckee et al. | 348/308 |

(Continued)

FOREIGN PATENT DOCUMENTS

EP    0 707 417 A2    4/1996

(Continued)

OTHER PUBLICATIONS

Miyatake, S. et al., "Transversal-Readout Architecture for CMOS Active Pixel Image Sensors", Electron Devices, IEEE Transactions, Jan. 2003, vol. 50, issue 1, pp. 121-129, http://ieeexplore.ieee.org/xpls/abs_all.jsp?arnumber=1185172.

(Continued)

*Primary Examiner* — John Lee
(74) *Attorney, Agent, or Firm* — David C. Kellogg

(57) ABSTRACT

Methods and apparatuses using pixels with shared readout circuits are used to increase pixel fill factor and operation efficiency.

37 Claims, 14 Drawing Sheets

U.S. PATENT DOCUMENTS

| | | | |
|---|---|---|---|
| 2006/0273240 | A1 | 12/2006 | Guidash et al. |
| 2006/0284177 | A1 | 12/2006 | Hynecek |
| 2007/0023797 | A1 | 2/2007 | Wu et al. |
| 2007/0023798 | A1 | 2/2007 | McKee |
| 2007/0034884 | A1 | 2/2007 | Mckee |
| 2007/0040922 | A1 | 2/2007 | McKee et al. |
| 2007/0045514 | A1 | 3/2007 | McKee et al. |
| 2007/0046796 | A1 | 3/2007 | McKee |
| 2007/0058062 | A1 | 3/2007 | Ohta |
| 2007/0084986 | A1 | 4/2007 | Yang et al. |
| 2007/0131992 | A1* | 6/2007 | Dosluoglu et al. ............ 257/292 |
| 2007/0153107 | A1 | 7/2007 | Boettiger et al. |
| 2007/0177044 | A1 | 8/2007 | Maruyama et al. |
| 2008/0136933 | A1* | 6/2008 | Dosluoglu et al. ......... 348/223.1 |
| 2008/0225148 | A1 | 9/2008 | Parks |
| 2008/0303930 | A1 | 12/2008 | Kuroda et al. |
| 2009/0046189 | A1* | 2/2009 | Yin et al. ...................... 348/308 |
| 2009/0053848 | A1* | 2/2009 | Fan ................................. 438/59 |
| 2009/0090845 | A1* | 4/2009 | Yin et al. ................... 250/208.1 |
| 2010/0252718 | A1* | 10/2010 | Lee ........................... 250/208.1 |

FOREIGN PATENT DOCUMENTS

| | | | |
|---|---|---|---|
| EP | 1 026 747 | A2 | 8/2000 |
| EP | 1 804 297 | A1 | 7/2007 |
| JP | 2003-32556 | | 1/2003 |
| JP | 2005-183527 | | 7/2005 |
| JP | 2005-318544 | | 11/2005 |
| JP | 2006-54276 | A | 2/2006 |
| JP | 2006-108497 | | 4/2006 |
| KR | 2004-0092809 | | 11/2004 |
| KR | 10-0598015 | B1 | 6/2006 |
| TW | 451584 | B | 8/2001 |
| WO | WO 03/071787 | A1 | 8/2003 |
| WO | WO 2006/122068 | A2 | 11/2006 |
| WO | WO 2007/024561 | A1 | 3/2007 |
| WO | WO 2007/024855 | A2 | 3/2007 |
| WO | WO 2007/027728 | A2 | 3/2007 |

OTHER PUBLICATIONS

Kwok, T. et al., "Readout circuit for CMOS Active Pixel Image Sensor", Department of Engineering, Cambridge University, UK, Mar. 28, 2002, vol. 38, issue 7, pp. 317-318, http://ieeexplore.ieee.org/xpls/abs_all.jsp?arnumber=995481.

Iida, Y. et al., "Study of Pixel Structure and Layout for CMOS Active Pixel Image Sensor", SPIE, Solid State Sensor Arrays: Development and Applications II, Apr. 1998, vol. 3301, pp. 158-167, http://www.spie.org/scripts/abstract.pl?bibcode=1998SPIE.3301.1581.

Cheng, H. et al., "An Ultra-low Dark Current CMOS Image Sensor Cell Using n/sup+/ring reset," Nat. Tsung Hua Univ., Hsinchu, Taiwan, Electron Device Letters, IEEE, Publication Date: Sep. 2002, vol. 23, Issue 9, pp. 538-540. http://ieeexplore.ieee.org/search/srchabstract.jsp?arnumber=1028992&isnumber=22109&punumber=55&k2dockey=1028992@ieeejrns&query=%28+%28+pixel%3Cin%Eab+%29+%3Cand%3E+%28+layout%3Cin%3Eab+%29+%29&pos=7. (abstract only).

Yasuda, T. et al., "Adaptive-Integration-Time Image Sensor with Real-Time Reconstruction Function." Dept. of Electr. Eng. Tokyo Univ. of Sci., Japan, Electron Devices, IEEE Transactions, Publication Date: Jan. 2003, vol. 50, Issue; 1, pp. 111-120. http://ieeexplore.ieee.org/search/srchabstract.jsp?arnumber=1185171&isnumber=26588&punumber=16&k2dockey=1185171@ieeejrns&query=%28+%28+pixel%3Cin%3Eab+%29+%3Cand%3E+%28+layout%3Cin%3Eab+%29+%29&pos=6. (abstract only).

Bermak, A. et al., "A High Fill-Factor Native Logarithmic Pixel: Simulation, Design and Layout Optimization," Sch. of Eng. & Math, Edith Cowan Univ., Joondalup, WA, Australia; Circuits and Systems, 2000. Proceedings. ISCAS 2000 Geneva. The 2000 IEEE International Symposium, Publication Date: May 28-31, 2000, vol. 5, pp. 293-296, vol. 5. http://ieeexplore.ieee.org/iel5/6910/18623/00857422.pdf?tp=&arnumber857422&isnumber=18623. (abstract only).

Brown, J.J. et al., "An Integrated Optically Powered, Optoelectronic 'Smart' Logic Pixel for Interconnection and Computing Applications," Hughes Res. Labs., Mallibur, Ca, USA; Quantum Electronics, IEEE Journal, Publication Date: Feb. 1993, vol. 29, Issue 2, pp. 715-726. http://ieeexplore.ieee.org/search/srchabstract.jsp?arnumber=199324&isnumber=5181&punumber=3&k2dockey=199324@ieeejrns&query=%28+%28+pixel%3Cin%3Eab+%29+ %3Cand%3.E+%28+layout%3Cin%3Eab+%29+%29&pos=8. (abstract only).

Chow, H. et al., "New Pixel-Shared Design and Split-Path Readout of CMOS Image Sensor Circuits," Institute of Semiconductor Technology, Chang Gung University, Taoyuan, Circuits and Systems, 2002, ISCAS 2002, IEEE International Symposium, vol. 4, pp. 1V-49-IV-52, Aug. 7, 2002. http://ieeexplore.ieee.org/xpls/abs_all.jsp?arnumber=1010385.

Mendis, S. et al., "Progress in CMOS Active Pixel Image Sensors," Center for Space Microelectronics Technology Jet Propulsion Laboratory, California Institute of Technology, Pasadena, CA, USA, Proceedings of the SPIE, vol. 2172, pp. 19-29, May 1994, Charge Coupled Devices and Solid State Optical Sensors IV. http://trs-new.jpl.nasa.gov/dspace/bitstream/2014/32570/1/94-0315.pdf.

Kemeny, S. et al., "CMOS Active Pixel Sensor Array with Programmable Multiresolution Readout," Jet Propulsion Laboratory, California Institute of Technology, Pasadena, CA, USA, 1995. http://trs-new.jpl.nasa.gov/dspace/bitstream/2014/29882/1/95/0698.pdf.

* cited by examiner

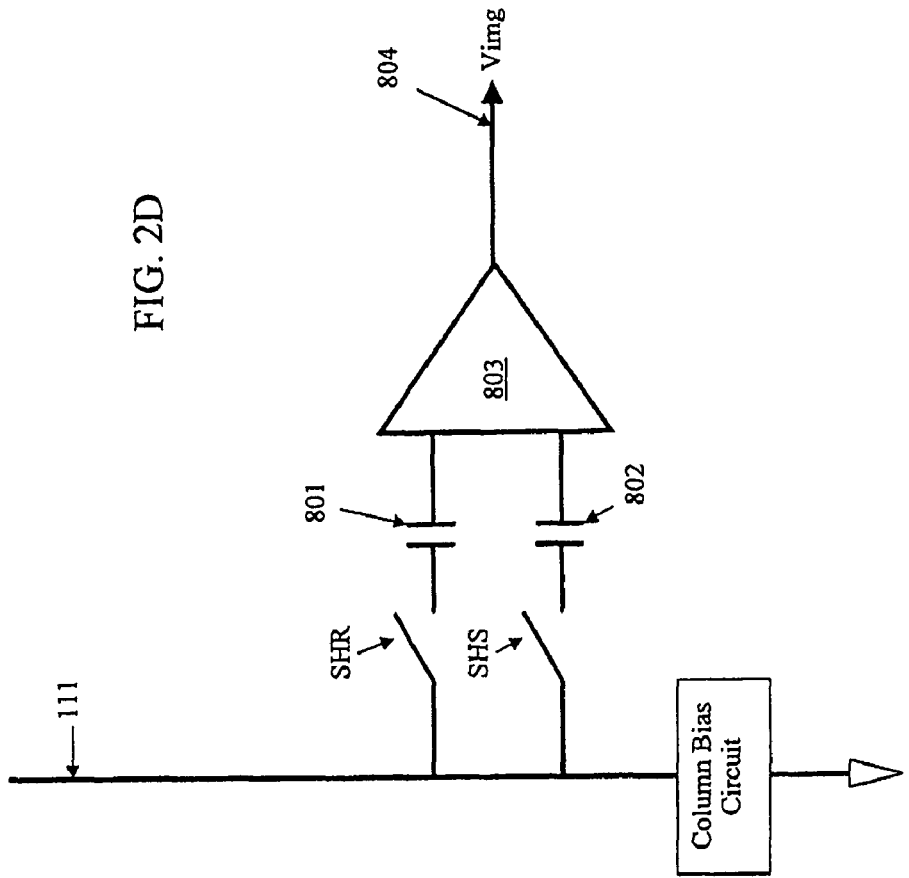

US 7,989,749 B2

METHOD AND APPARATUS PROVIDING SHARED PIXEL ARCHITECTURE

FIELD OF THE INVENTION

The embodiments described herein relate generally to imaging devices and, more specifically, to a method and apparatus providing a shared pixel architecture for imaging devices.

BACKGROUND OF THE INVENTION

Solid state imaging devices, including charge coupled devices (CCD), complementary metal oxide semiconductor (CMOS) imaging devices, and others, have been used in photo imaging applications. A solid state imaging device circuit includes a focal plane array of pixels as an image sensor, each pixel including a photosensor, which may be a photogate, a photoconductor, a photodiode, or other photosensor having a doped region for accumulating photo-generated charge. For CMOS imaging devices, each pixel has a charge storage region, formed on or in the substrate, which is connected to the gate of an output transistor that is part of a readout circuit. The charge storage region may be constructed as a floating diffusion region. In some CMOS imaging devices, each pixel may further include at least one electronic device such as a transistor for transferring charge from the photosensor to the storage region and one device, also typically a transistor, for resetting the storage region to a predetermined charge level.

In a CMOS imaging device, the active elements of a pixel perform the necessary functions of: (1) photon to charge conversion; (2) accumulation of image charge; (3) resetting the storage region to a known state; (4) transfer of charge to the storage region; (5) selection of a pixel for readout; and (6) output and amplification of a signal representing pixel charge. Photo charge may be amplified when it moves from the initial charge accumulation region to the storage region. The charge at the storage region is typically converted to a pixel output voltage by a source follower output transistor.

A conventional four transistor (4T) CMOS image sensor pixel 100 is shown in FIG. 1. The pixel 100 includes a photosensor 102 (e.g., photodiode, photogate, etc.), transfer transistor 104 (having a gate 104a), floating diffusion region FD, reset transistor 106 (having a gate 106a), source follower transistor 110 (having a gate 110a), and row select transistor 112 (having a gate 112a). The photosensor 102 is connected to the floating diffusion region FD by the transfer transistor 104 when the gate 104a is activated by a transfer control signal TX.

The reset transistor 106 is connected between the floating diffusion region FD and a voltage supply line 206. A reset control signal RST is applied to reset transistor gate 106a to activate the reset transistor 106, which resets the floating diffusion region FD to the voltage supply line 206 level as is known in the art.

The source follower transistor 110 is connected between the voltage supply line 206 and the row select transistor 112. Source follower transistor gate 110a is connected to the floating diffusion region FD. The source follower transistor 110 converts the charge stored at the floating diffusion region FD into an electrical output voltage signal Vout. The row select transistor 112 is controllable by gate 112a (activated by a row select signal ROW) for selectively connecting the source follower transistor 110 and its output voltage signal Vout to a column line of a pixel array.

In order to capture images with greater resolution while also maintaining a small image sensor size, it is desirable to design image sensors with a large number of relatively small pixels. Unfortunately, as pixels 100 become smaller, many of the transistors responsible for reading out pixel signals, such as transistors 106, 110, and 112 in FIG. 1, cannot be made smaller and begin to take up most of the space allocated to each pixel 100. Consequently, the photosensor 102 becomes smaller while more of the pixel area is used by the pixel transistors, such that, the pixel's 100 fill factor, which is the percentage of a pixel that is photosensitive, is reduced. As photosensor size and pixel fill factor shrink, the amount of light that is converted to a signal within each pixel decreases as well. Accordingly, there is a need for a pixel architecture that allows for smaller pixels with higher fill factors. There is also a need for a pixel architecture that can operate at high speed as pixel density increases.

BRIEF DESCRIPTION OF THE DRAWINGS

FIG. 2D is a schematic diagram of a sample and hold circuit associated with the embodiment of FIG. 2B.

DETAILED DESCRIPTION OF THE INVENTION

In the following detailed description, reference is made to the accompanying drawings which form a part hereof, and in which is shown by way of illustration specific embodiments that may be practiced. These embodiments are described in sufficient detail to enable those of ordinary skill in the art to make and use them, and it is to be understood that structural, logical, or procedural changes may be made to the specific embodiments disclosed.

The terms "semiconductor substrate" and "substrate" are to be understood to include any semiconductor-based structure. The semiconductor structure should be understood to include silicon, silicon-on-insulator (SOI), silicon-on-sapphire (SOS), silicon-germanium, doped and undoped semiconductors, epitaxial layers of silicon supported by a base semiconductor foundation, and other semiconductor structures. When reference is made to the substrate in the following description, previous process steps may have been utilized to form regions or junctions in or over the base semiconductor or foundation.

The term "pixel," as used herein, refers to a photo-element unit cell containing at least a photosensor for converting photons to electrical changes. In the following description, the embodiments are described in relation to a CMOS imaging device for convenience; however, they have wider applicability to other pixels of other imaging devices. In addition, the photosensor of each pixel may be implemented as a pinned photodiode, a p-n junction photodiode, a Schottky photodiode, a photogate, or any other suitable photoconversion device.

As described above, a problem associated with using smaller pixels is that the transistors for reading out the pixel signals take up more space than the photosensitive area of the pixel. Shared pixel arrangements of the type described in U.S. Patent Publications 2006-0256221 and 2007-0040922, where a plurality of photosensors share a readout circuit, improve the pixel fill factor, but additional improvements are still needed. In addition, as shown in U.S. Patent Publication 2007-0040922, some shared pixel arrangements may have transfer gates which are of unusual shape, which adds to fabrication complications and may adversely affect readout speed, particularly in high density pixel arrays. In order to decrease the area used by readout circuits, embodiments described herein consolidate circuits from several pixels into a pixel block, reducing the number of components in each pixel and increasing the fill factor of each pixel. Additionally, embodiments use "straight gate" transfer gates to increase the readout speed and symmetry of the pixels and to simplify fabrication.

Figure 1:
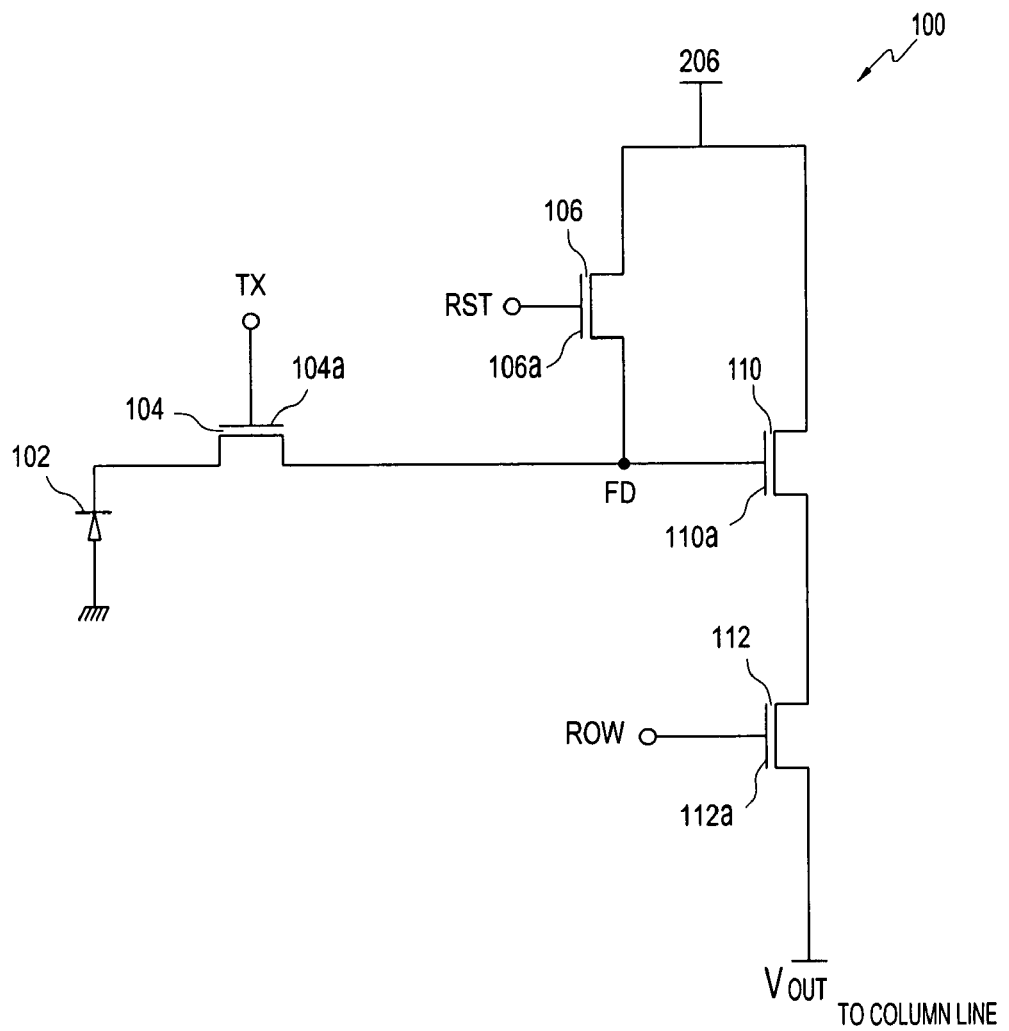
FIG. 1 is a schematic diagram of a conventional four-transistor pixel.
Figure 2A:
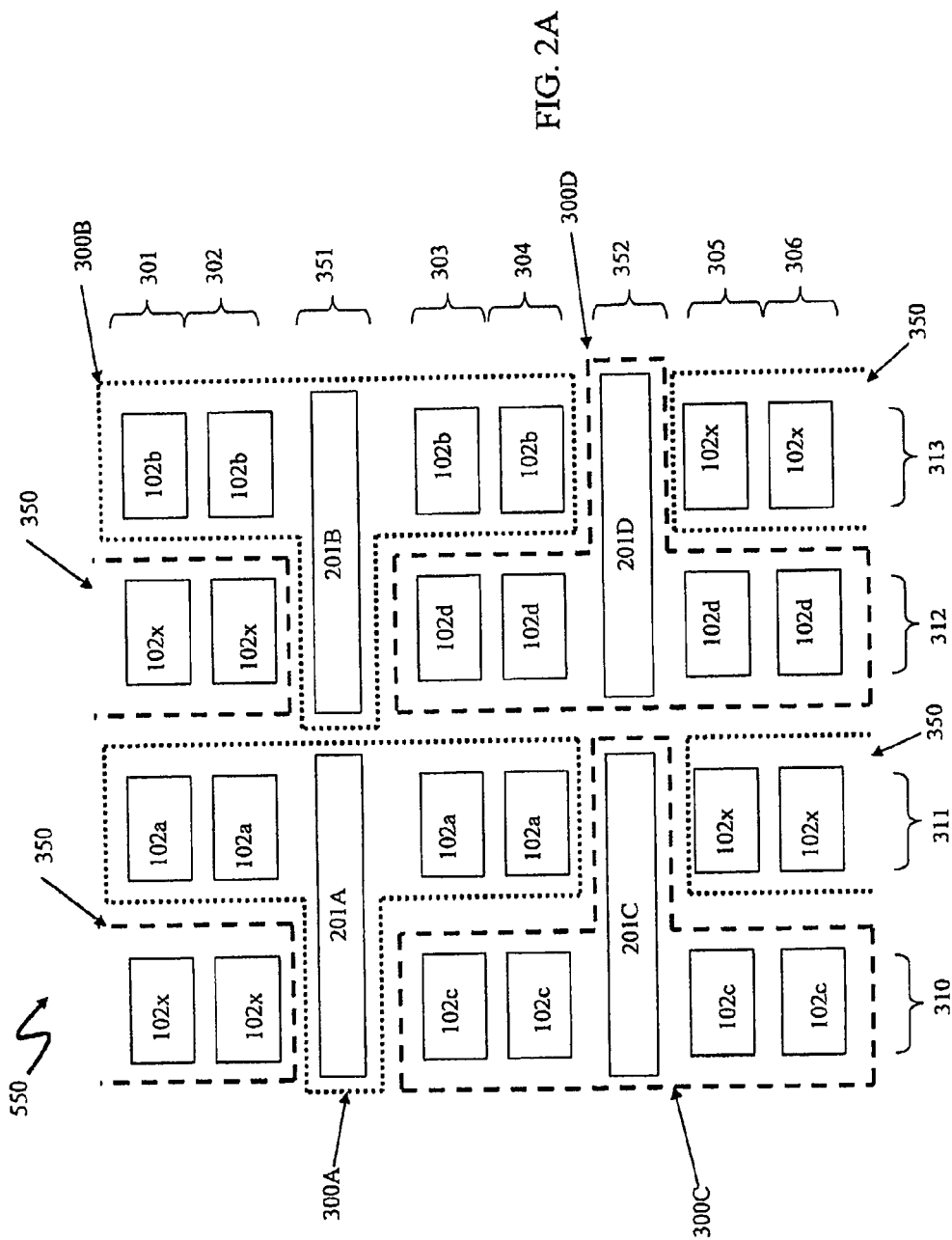
FIG. 2A is a top-down layout of four shared straight gate pixel blocks according to an embodiment described herein.

FIG. 2A is a top down view of a representative section of a pixel array according to one embodiment. The pixel array 550 is composed of rows 301-306 and columns 310-313 of photosensors 102. Between some photosensor rows, e.g. between rows 302 and 303 and between rows 304 and 305, are readout circuit rows, e.g. 351, 352, containing readout circuits, e.g. 201A-201D, as described below. Four photosensors 102 are connected to a shared readout circuit 201 for example, four photosensors 102a share a readout circuit 201A, four photosensors 102b share a readout circuit 201B, and so forth. Each shared readout circuit, e.g. 201A, is responsible for reading out the signals produced by changes accumulated within each of its four associated photosensors, e.g. 102a. Together, a shared readout circuit, e.g. 201A, and its four associated photosensors, e.g. 102a, are called a pixel block, with four such blocks 300A-300D being shown in FIG. 2A. As seen in the FIG. 2A, four photosensors in each of the blocks 300A-300D are arranged linearly in one of the photosensor columns 310-313. For example, pixel block 300A contains four photosensors 102a and a shared readout circuit 201A, as shown by the dotted block 300A in FIG. 2A, with the photosensors 102a arranged linearly in column 311. Several photosensors 102x in FIG. 2A are part of pixel blocks that extend beyond what is shown in FIG. 2A.

The embodiment shown in FIG. 2A is a "shifted configuration," so-called because a pixel block, e.g. 300A, is shifted by two photosensor rows relative to an adjacent pixel block, e.g. 300C. Thus, pixel block 300C, having photosensors 102c in column 310, spans four photosensor rows 303-306 and is shifted two photosensor rows down relative to adjacent pixel block 300A, having photosensors 102a in column 311, which spans photosensor rows 301-304. In a shifted configuration such as that shown in FIG. 2A, each of the shared readout circuits, e.g. 201A, for a pixel block, e.g. 300A, in one column, e.g. 311 extends into and between pixel blocks having photosensors in an adjacent column, e.g. 310. The shared readout circuits extend in a direction of the photosensor rows, but the extended part of the readout circuit can extend to the left or right in the FIG. 2A view based on the column in which the photosensors of the shared readout circuit are located. Pixel blocks 300C and 300D, having photosensors 102c, 102d located in even numbered columns 310, 312, contain shared readout circuits 201C, 201D extending into columns 311, 313 to the right of the columns 310, 312 in which the associated photosensors 102C, 102D are arranged. Conversely, the shared readout circuits 201A of pixel blocks 300A and 300B, having associated photosensors 102a, 102b arranged in odd number columns 311, 313, extend into columns 310, 312 to the left of the columns 311, 313. Because of the extended shared readout circuit 201A-201D, the pixel blocks 300A-300D in FIG. 2A have a "T-shape," resembling a "T" rotated ninety degree clockwise or counterclockwise.

Figure 2B:
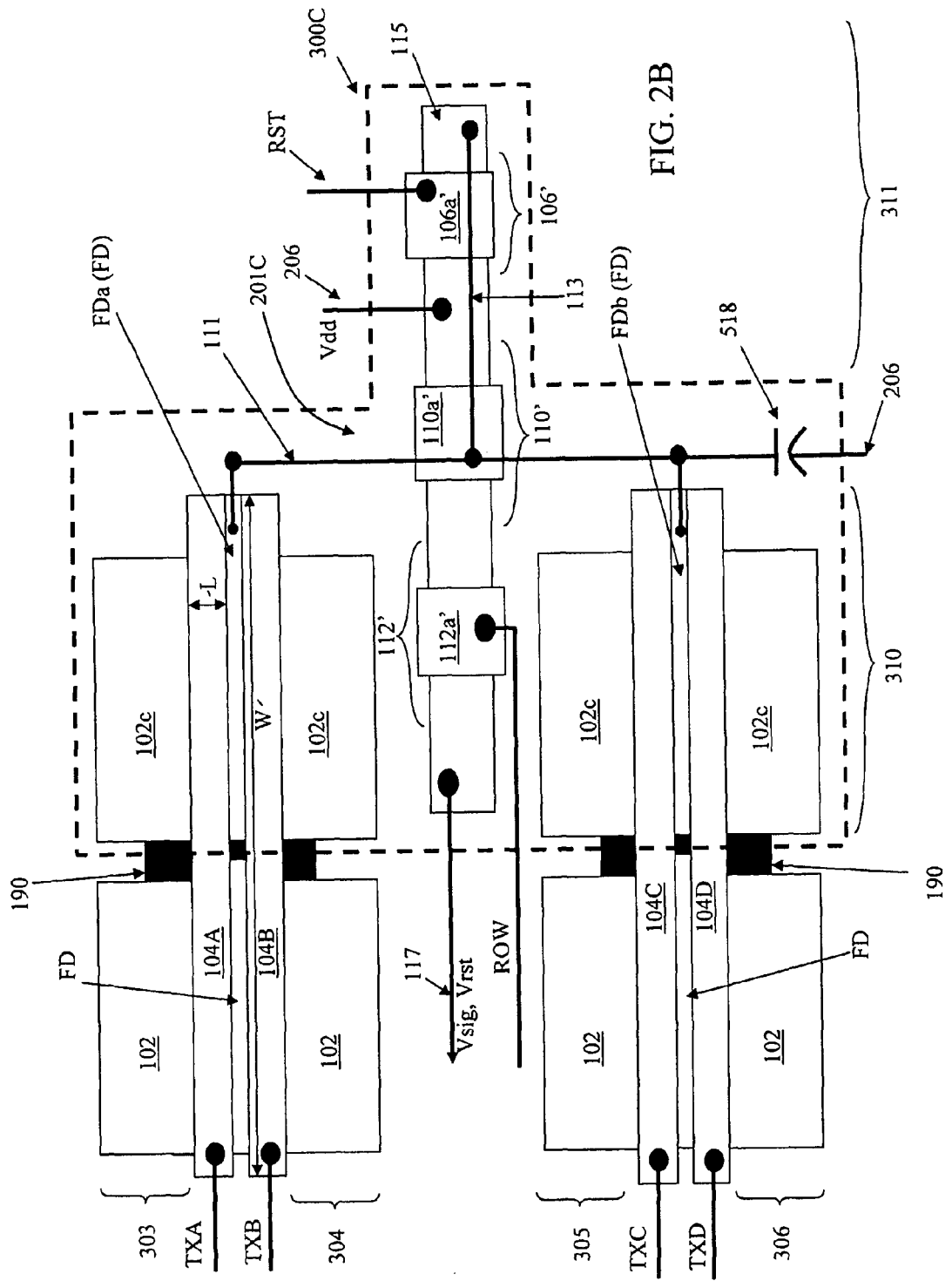
FIG. 2B is a top-down layout of a shared straight gate pixel block according to an embodiment described herein.
Figure 2C:
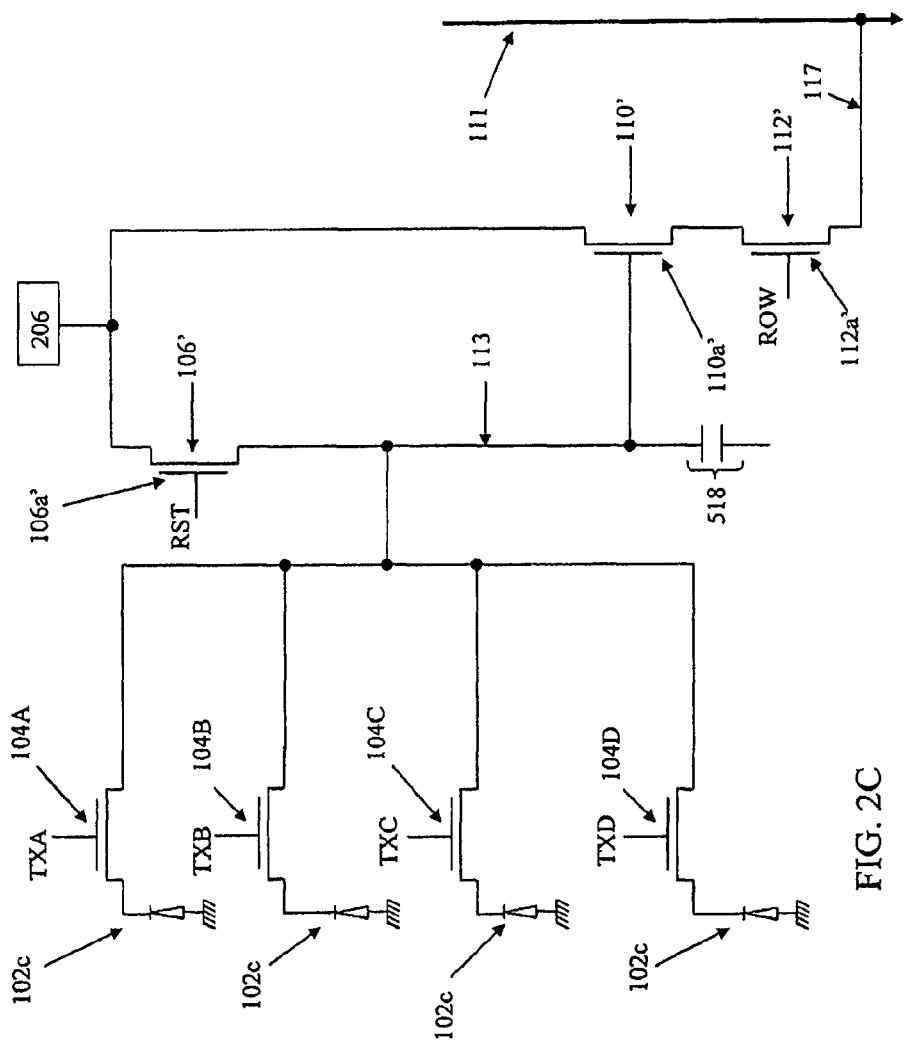
FIG. 2C is a schematic of the shared pixel block shown in FIG. 2B.

FIG. 2B shows in greater detail a top down view of one exemplary pixel block 300C, while FIG. 2C shows the electrical schematic circuit. Pixel block 300C contains four photosensors 102c and a shared readout circuit 201C, composed of shared reset transistor 106' (having a gate 106a'), shared source follower transistor 110' (having a gate 110a'), and shared row select transistor 112' (having a gate 112a'). The photosensors 102c may be separated from neighboring photosensors 102 by regions of dielectric shallow trench isolation 350 (STI). The shared readout circuit shown in FIG. 2B extends from photosensor column 310 into the photosensor column 311 to the right of the pixel block 300C.

The photosensors 102c are connected via respective individual transfer gates 104A-104D to one of the two floating diffusion regions FDa, FDb within pixel block 300C. The transfer gates 104A-104D are not angled relative to their respective photosensors 102A-102D, but are arrayed as straight gates, extending parallel to at least an entire linear edge of an associated photosensor 102C. In the embodiment of FIG. 2B, the transfer gates 104A-104D are fabricated such that their length is oriented in the same direction as photosensor rows 301-306. Transfer gates 104A-104D may be shared between adjacent photosensors in different pixel blocks 300, for example transfer gate 104A in FIG. 2B is shared between a photosensor 102c in pixel block 300C and a photosensor 102 in an adjacent pixel block. The photosensors 102 in adjacent pixel blocks may be separated by a Shallow Trench Isolation (STI) region 190. The STI regions 190, which may be partially overlapped by the transfer gates 104A-104D, prevent charge leakage between adjacent photosensors 102. Each transfer gate 104A-104D has a length (L) and width (W) and a generally rectangular shape. The length (L) and width (W) of the transfer gate 104A-104D may be varied in accordance with the sizes of the photosensors 102c and floating diffusion regions FDa, FDb, which run between and partially beneath gates 104A, 104B and 104C, 104D respectively, and for desired operational characteristics. For example, wider or longer transfer gates 104A-104D allow for more overlap between the transfer gates 104A-104D and the respective photosensors 102c and/or the floating diffusion regions FDa or FDb. A larger overlap allows more charge transfer from the photosensors 102c to the associated floating diffusion region FDa or FDb in less time. This, in turn, reduces overall lag time to transfer charges from a photosensor to a floating diffusion region within the pixel block 300C.

The illustrated floating diffusion regions FDa, FDb are electrically connected to each other to collectively form a common floating diffusion region FD by an electrical connection 111. The common floating diffusion region FD is also connected to reset transistor 106' by an electrical connection 113, and to a source follower transistor gate 110a'. The common floating diffusion region FD may also be electrically connected to an optional capacitor 518, as shown in FIGS. 2B, 2C, in order to increase the charge storage capacity of the common floating diffusion region FD. The reset transistor gate 106a is controlled by a signal line that carries the RST control signal to reset node 115 and, in turn, the floating diffusion region FD using a voltage supply line 206. The source follower transistor 110' is also connected to the voltage supply line 206 and converts the charge stored on the common floating diffusion region FD into an analog output signal. The charge on the common floating diffusion region FD is an image signal charge, after a transfer gate 104A-104D has been activated by one of the transfer control signals TXA-D to allow charge from a respective photosensor 102c to reach the common floating diffusion region FD, or a reset charge, after the reset transistor 106' has been activated by reset control signal RST to reset the common floating diffusion region FD. The charges at the common floating diffusion region FD are respectively converted by the source follower transistor 110' into an image signal Vsig and a reset signal Vrst. Both signals Vrst, Vsig are read out in a known correlated double sampling operation. The analog signals Vrst, Vsig produced by the source follower transistor 110' are then passed through row select transistor 112', which is controlled by the row select signal ROW, and are passed down the pixel output line 117 to a respective array column line 111 as output voltage signals.

Pixel block 300D (FIG. 2A) is constructed identically to pixel block 300C. A similar, but reversed, layout is used for pixel blocks 300A and 300B in FIG. 2A. The electrical schematic view of the embodiment shown in FIG. 2B is shown in FIG. 2C.

As shown in FIG. 2D, a column of pixels (and the associated column output line 111) is associated with sample and hold capacitors 801, 802 of a sample and hold circuit and a differential amplifier 803 to subtract the Vrst and Vsig signals for each pixel. Each column output line 111 is connected to a reset sample and hold capacitor 801 by a switch responsive to reset sample control signal SHR. When the column output line 111 carries a reset signal Vrst, SHR is activated and Vrst is sampled and held on capacitor 801. Each column output line 111 is also connected to a signal sample and hold capacitor 802 by a switch responsive to signal sample control signal SHS. When the column output line 111 carries an image signal Vsig, SHS is activated and Vsig is sampled and held on capacitor 802. When both signals Vrst, Vsig are held on capacitors 801, 802, differential amplifier 803 subtracts the signals to produce a corrected image signal Vimg (which represents Vsig−Vrst or Vrst−Vsig) on signal output line 804 for further processing.

As described above with reference to FIG. 2A, each pixel block, e.g. 300A, may be offset by two photosensor rows from an adjacent pixel block, e.g. 300C, in an adjacent column. Each photosensor in a single row, e.g. 301, (FIG. 2A) is associated with a transfer gate (such as transfer gates 104A-D in FIG. 2B), and all transfer gates in a single row, e.g. 301, are operated by a single transmit signal TX carried on a single control line. Each shared readout circuit, e.g. 201A, serves four rows, e.g. 301-304, of photosensors 102a, however the readout circuits, e.g. 201C, 201D, of pixel blocks, e.g. 300C, 300D, having photosensors within even-numbered columns 310, 312 do not serve the same photosensor rows 301-306 as the readout circuits, e.g. 201A, 201B, of pixel blocks, e.g. 300A, 300B, having photosensors in odd-numbered columns 311, 313. For that reason, there is one set of control lines for the shared readout circuits 201C, 201D in pixel blocks 300C, 300D in even-numbered columns 310, 312 and another set of control lines for shared readout circuits 201A in pixel blocks 300A, 300B in odd-numbered columns 311, 313. Thus, to read out a row of photosensors 200 in a pixel array, two sets of control lines for the readout circuits serving the photosensors in a row must be operated simultaneously. For example, in FIG. 2A, reading out the photosensors in row 303 requires accessing the readout circuitry 201C in pixel block 300C for the photosensor 102c in column 310, the readout circuitry 201A in pixel block 300A for the photosensor 102a in column 311, the readout circuitry 201D in pixel block 300D for the photosensor 102d in column 312, and the readout circuitry 201B in pixel block 300B for the photosensor 102b in column 313. To simplify the readout of the photosensors in a single row in the embodiment shown in FIG. 2A, certain control lines are combined to activate the correct sets of readout circuits 201A-201D as shown in FIGS. 3A and 3B.

Figure 3A:
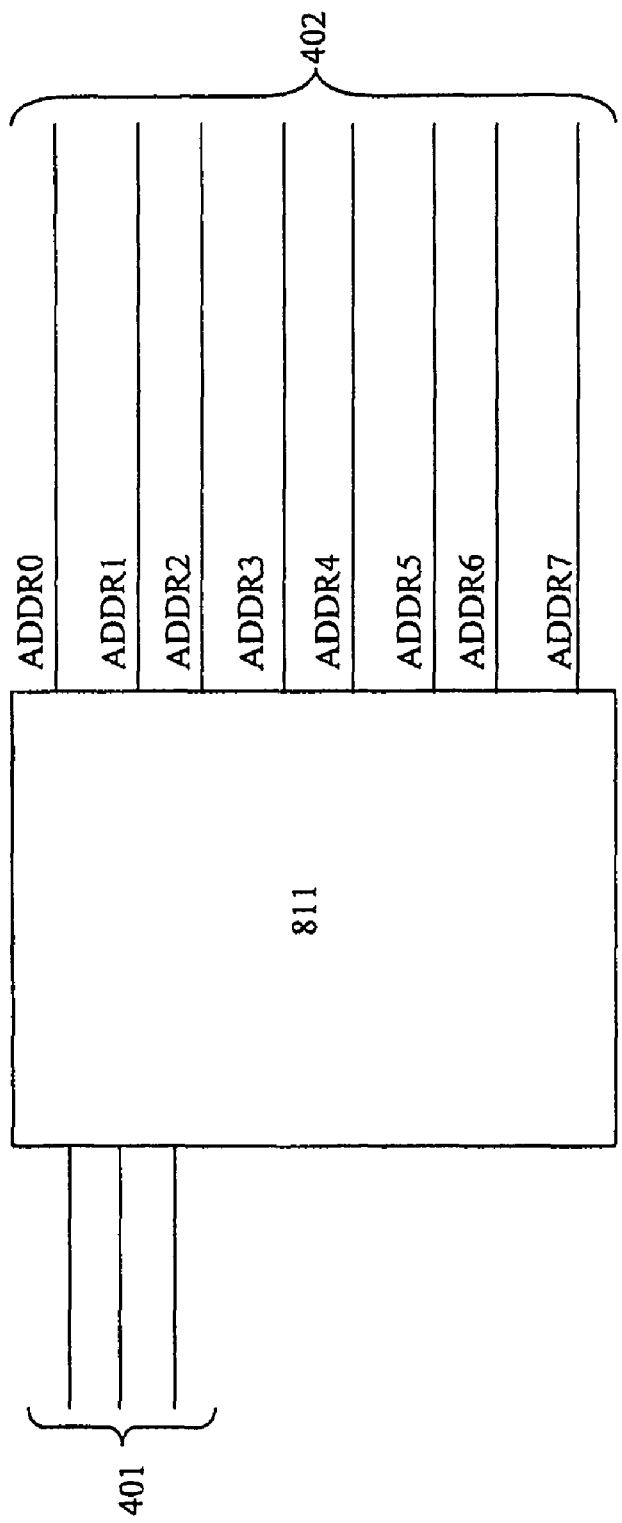
FIG. 3A shows a row decoder and its associated input and output lines.

FIG. 3A shows a simplified row decoder 811 according to an embodiment described herein. The row decoder 811 accepts a set of N input lines 401, in this embodiment there are three input lines for simplicity, which represent an N-bit binary number. The number is an address, corresponding to a particular photosensor row of the array to be read out (each row of the array has a numerical address, beginning with row 0). The row decoder 811 produces a set of output signals ADDR0-ADDR7 on output lines 402. In the illustrated embodiment, there is an output line 402 for each row of photosensors in the array. In operation of row decoder 811, every output line 402 is given a logic low signal (a voltage level corresponding to a logical 0) except for the output line 402 corresponding to the row addressed by input lines 401. For example, if the input lines 401 carried the binary number "010" (representing a decimal number "2" and thus indicating the third row in the array), all but the third output line 402 would carry a logic low. The third output line 402 would carry an ADDR2 signal. With N input lines 401, the row decoder 811 may have $2^N$ output lines. Each output line is then used to control the readout circuitry 201 associated with a row of photosensors, ensuring that only one row is read out at a time. Though the simplified row decoder 811 in FIG. 3A addresses only 8 rows within the array, in practice the row decoder 811 will be larger and address a larger number of pixel rows.

Figure 3B:
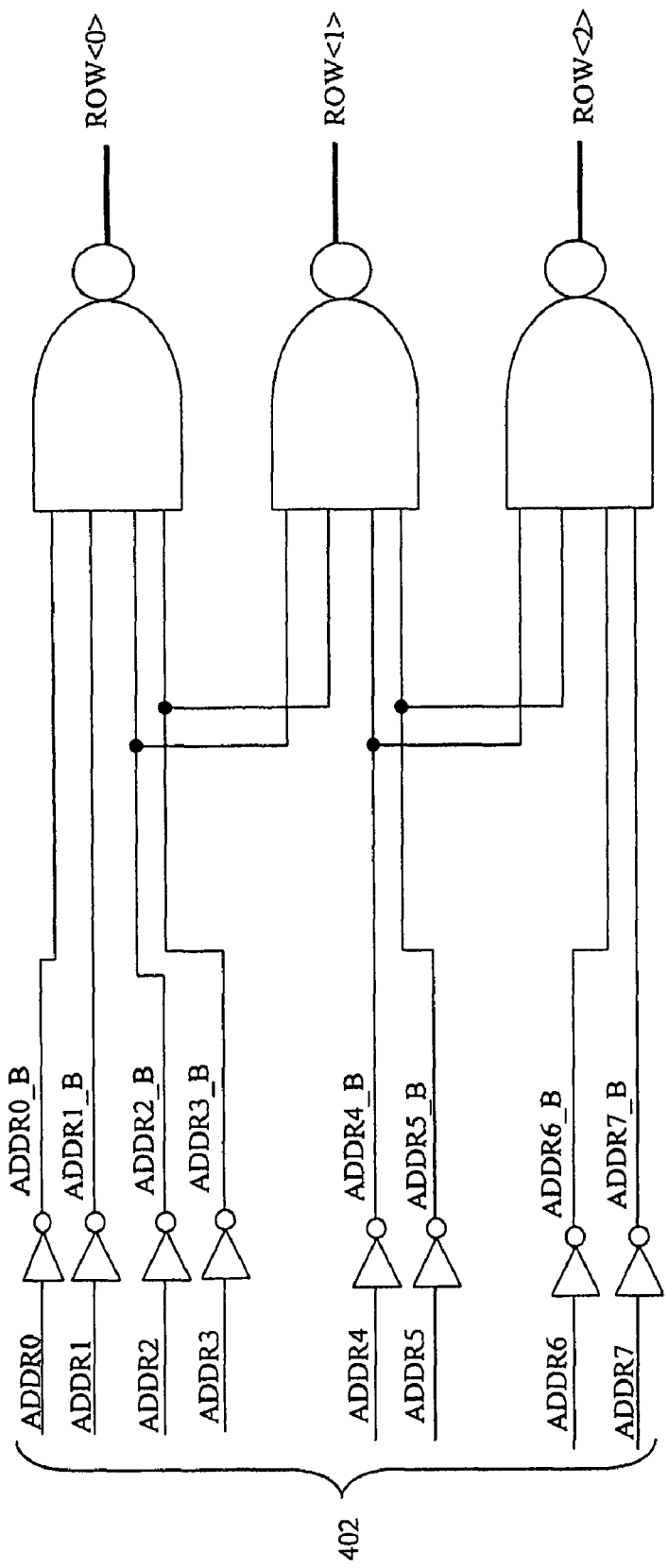
FIG. 3B is a schematic of shifted-configuration control lines and associated logic circuits for the pixel blocks of FIG. 3A.

FIG. 3B shows the set of output lines 402 for carrying signals ADDR0-ADDR7, used to control components of pixel blocks 300 (FIG. 2A), such as readout circuitry 201A-201D (FIG. 2A). Control signal ADDR0 is activated to allow the read out of photosensors 102 in row 301 in FIG. 2A, control signal ADDR1 is activated to allow the read out of photosensors 102 in row 302, and so on. Because photosensors 102 of a pixel group share readout circuitry 201 with photosensors in other rows, each readout circuit, e.g. 201A, should be activated whenever any one of the control signals is activated for a row containing a photosensor, e.g. 102a, associated with the pixel block readout circuit, e.g. 201A. It is useful to group control signals, e.g. ADDR0-ADDR3, into a single control signal, e.g. ROW<0>, for any readout circuit, e.g. 201A, associated with photosensors in rows associated with those signals.

In the embodiment illustrated in FIG. 3B, each control signal ADDR0-ADDR7 on an output line 402 is inverted to create inverted control signals ADDR0_B-ADDR7_B. The inverted control lines ADDR0_B-ADDR3_B for controlling the read out of rows 301-304 in FIG. 2A are grouped into a grouped control signal ROW<0>. Grouping should be interpreted to mean a logical OR operation, such that whenever one of the control signals, e.g. ADDR0-ADDR3, is activated, the associated grouped control signal, e.g. ROW<0>, is also activated.

Control signal ROW<0> may be used to control readout circuits 201A, 201B (FIG. 2A) in readout circuit row 351 (FIG. 2A), each of which is used for reading out photosensors 102a, 102b (FIG. 2A) in photosensor rows 301-304 (FIG. 3A). Similarly, grouped control signal ROW<1>, the result of grouping control signals ADDR2-ADDR5 (FIG. 3A), is suitable for controlling readout circuits 201C, 201D (FIG. 2A) in readout circuit row 352 (FIG. 2A), which are responsible for photosensors 102c, 102d (FIG. 2A) in photosensor rows 303-306 (FIG. 2A). Grouped control signal ROW<2> may be used for controlling readout circuits (not shown) just below photosensor row 306 in FIG. 2A, which are responsible for photosensors 102x in photosensor rows 305 and 306.

Because some photosensor rows, e.g. 303, contain photosensors, e.g. 102a-102d, with readout circuits, e.g. 201A-201D, in multiple readout circuit rows, e.g. 351, 352, the control signal for allowing the readout of that row, e.g. ADDR2, may be grouped with other control signals, e.g. ADDR0-ADDR5, into several grouped control signals, e.g. ROW<0> and ROW<1>, as shown in FIG. 3B. Though the grouping in FIG. 3B is depicted as the result of inverted AND gates 401 in conjunction with inverted output signals 403, it may implemented with other circuits known in the art.

Figure 4:
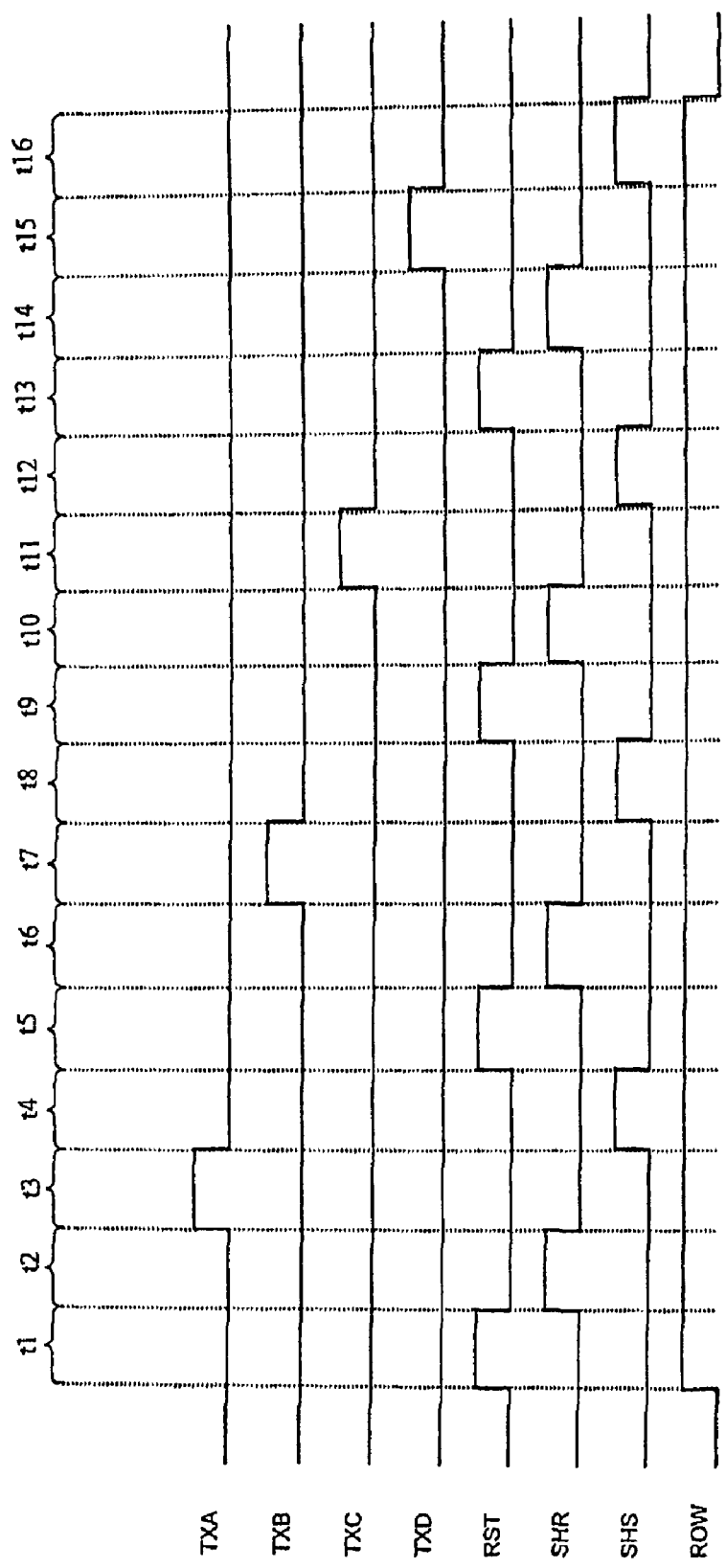
FIG. 4 is a timing diagram corresponding to the shared straight gate pixel block of FIG. 2B.

FIG. 4 shows a timing diagram of an example operation of a pixel block, e.g. 300C (FIG. 2B), and column line sample and hold circuitry during a readout cycle. As described above, the sample and hold circuits 801, 802 (FIG. 2C) sample and hold a pixel reset signal Vrst using the reset sample and hold control signal SHR associated with each photosensor in pixel block 300C. The sample and hold circuits 801, 802 also sample and hold the pixel image signal Vsig using the image sample and hold control signal SHS associated with each photosensor in pixel block 300C.

After an image has been exposed to a pixel array containing a pixel block, e.g. 300C (FIG. 2B), the readout cycle begins as the ROW signal is activated at time t1. The ROW signal is a logical OR of the inverted output lines 403 (FIG. 3B), e.g. ROW<1> in FIG. 3B, where the inverted output lines 403 are associated with rows, e.g. 303-306, containing the photosensors of pixel block 300C. The ROW signal remains activated throughout the entire readout process for the pixel block, e.g. 300C, (in FIG. 4 all signals are depicted as high when active, regardless of voltage). During time t1, the RST signal is activated, which allows the voltage supply line 206 (FIG. 2B) to connect to the floating diffusion region FD and reset the floating diffusion region FD. The reset charge on the floating diffusion region FD is converted into a voltage Vrst by a source follower transistor having gate 110a' (FIG. 2B) and is passed through the row select transistor having gate 112a' (FIG. 2B) as signal Vrst. At time t2, RST is deactivated to disconnect the floating diffusion regions FD from the voltage supply line 206. Also at time t2, a reset sample and hold control signal SHR is activated, which allows the reset sample and hold circuit 801 (FIG. 2C) to sample and hold the value of Vrst. After time t2, the reset sample and hold circuit 801 is holding the voltage representing the reset charge on floating diffusion region FD.

During time t3, transfer control signal TXA is activated, which allows transfer gate 104A (FIG. 2B) to transfer the charge which was accumulated on photosensor 102c (FIG. 2B) in, e.g. row 303, during an image capture integration period to the common floating diffusion region FD. That charge is converted into a voltage Vsig by source follower transistor having gate 110a' (FIG. 2B) and passes through row select transistor having gate 112a' (FIG. 2B). During time t4, TXA is deactivated and an image sample and hold control signal SHS is activated, allowing sample and hold circuit 802 (FIG. 2C) to sample and hold the voltage Vsig produced by the charge on floating diffusion region FD (FIG. 3B). The difference between the sampled and held signals Vrst and Vsig represents the amount of light that reached photosensor 102c (FIG. 2B) during the integration period. The two voltages are supplied to a differential amplifier 803 (FIG. 2D), which subtracts them to supply an analog signal to other components for further processing, such as analog-to-digital conversion, color correction, defect correction, and other image processing operations. During times t5 through t8, the process above (using transfer control signal TXB (FIG. 2B to control transfer gate 104B in place of TXA and 104A) is repeated to read out the value of photosensor 102c in the next row, e.g. 304. Times t9 through t12 represent the same process for a third photosensor 102c in the next row, e.g. 305, using transfer control signal TXC to control transfer gate 104C, and times t13 through t16 represent the readout process for the fourth photosensor 102c in the next row, e.g. 306, using transfer control signal TXD to control transfer gate 104D.

Figure 5A:
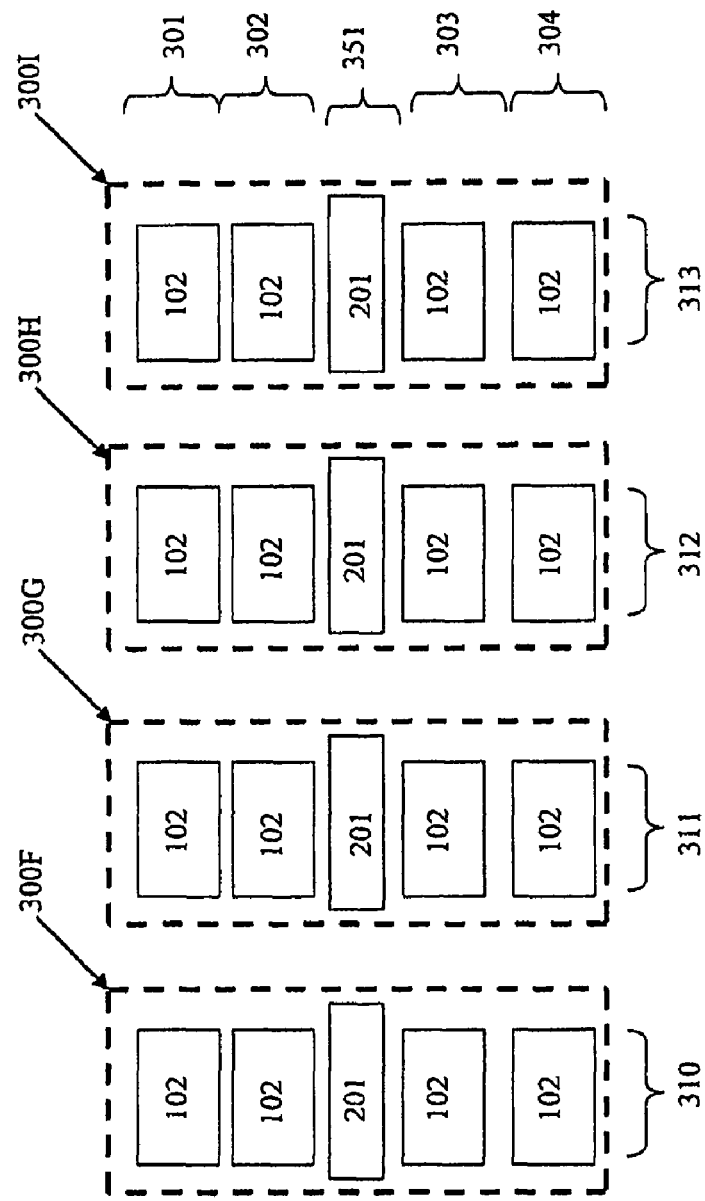
FIG. 5A is a top-down layout of four shared straight gate pixel blocks according to an embodiment described herein.
Figure 5B:
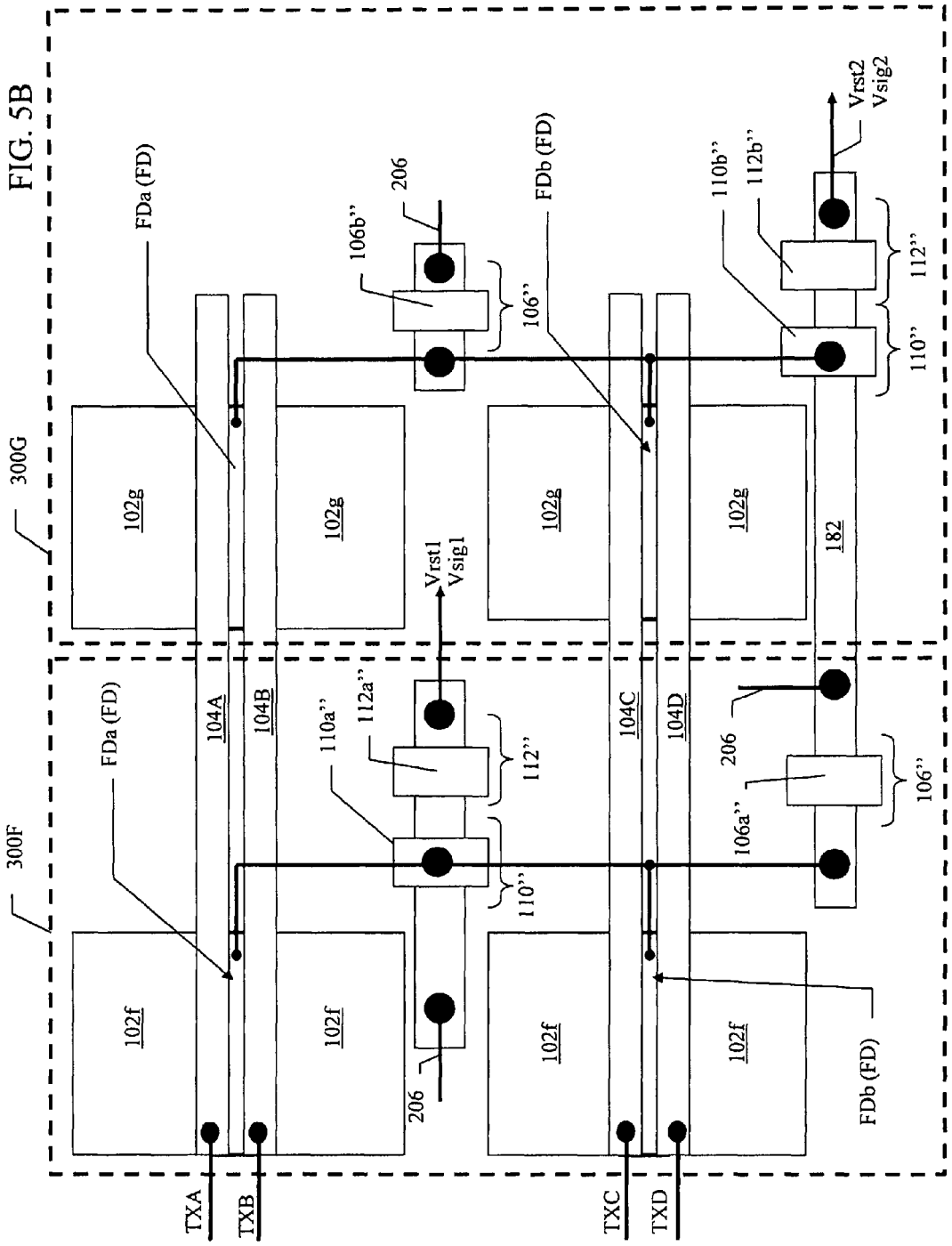
FIG. 5B is a top-down layout of two shared straight gate pixel blocks according to an embodiment described herein.

FIGS. 5A and 5B show another embodiment, similar to FIG. 2A, however the pixel blocks 300F-300I are not shifted relative to pixel blocks in adjacent columns, resulting in an "unshifted configuration." Each pixel block 300F-300I spans the same rows as the row-wise adjacent pixel block in each adjacent column. Each pixel block contains four photosensors 102 and a readout circuit 201 that is shared among the four photosensors 102. For illustrative purposes, FIG. 5A depicts the shared readout circuits 201 as contained within linear columns of photosensors 102, giving the pixel blocks 300F-300I an overall rectilinear shape. For practical reasons, the shared readout circuit 201 for one pixel block, e.g. 300F, may be electrically connected to a shared readout circuit 201 of a pixel block, e.g. 300F, in an adjacent column, as discussed below with reference to FIG. 5B.

FIG. 5B shows a top down layout of two adjacent pixel blocks, e.g. 300F, 300G, with electrical connections in an unshifted configuration, arranged, for example, as shown in FIG. 5A. The pixels, represented as the photosensors 102f, in pixel block 300F of FIG. 5B share a reset transistor 106" having gate 106a", a source follower transistor 110" having gate 110a", and a row select transistor 112" having gate 112a", while the pixels, represented by photosensors 102g, in pixel block 300G share a different set of transistors having respective reset transistor gate 106b", source follower transistor gate 110b", and row select transistor gate 112b". As in FIG. 2B, transfer gates 104A-104D in the FIG. 5B embodiment may be shared across pixels blocks 300F, 300G. Transfer gates 104A-104D are shown spanning two pixel blocks 300F, 300G, however each transfer gate 104A-104D could be extended to serve any number of photosensors in a row of the array. No readout transistors other than the transfer gates 104A-104D are shared between pixel blocks 300F and 300G; however, an active area 182 which is used to supply operating voltage to transistors 106" and 110" in different pixel blocks 300F and 300G may extend between and be shared by pixel block 300F and 300G.

Figure 6:
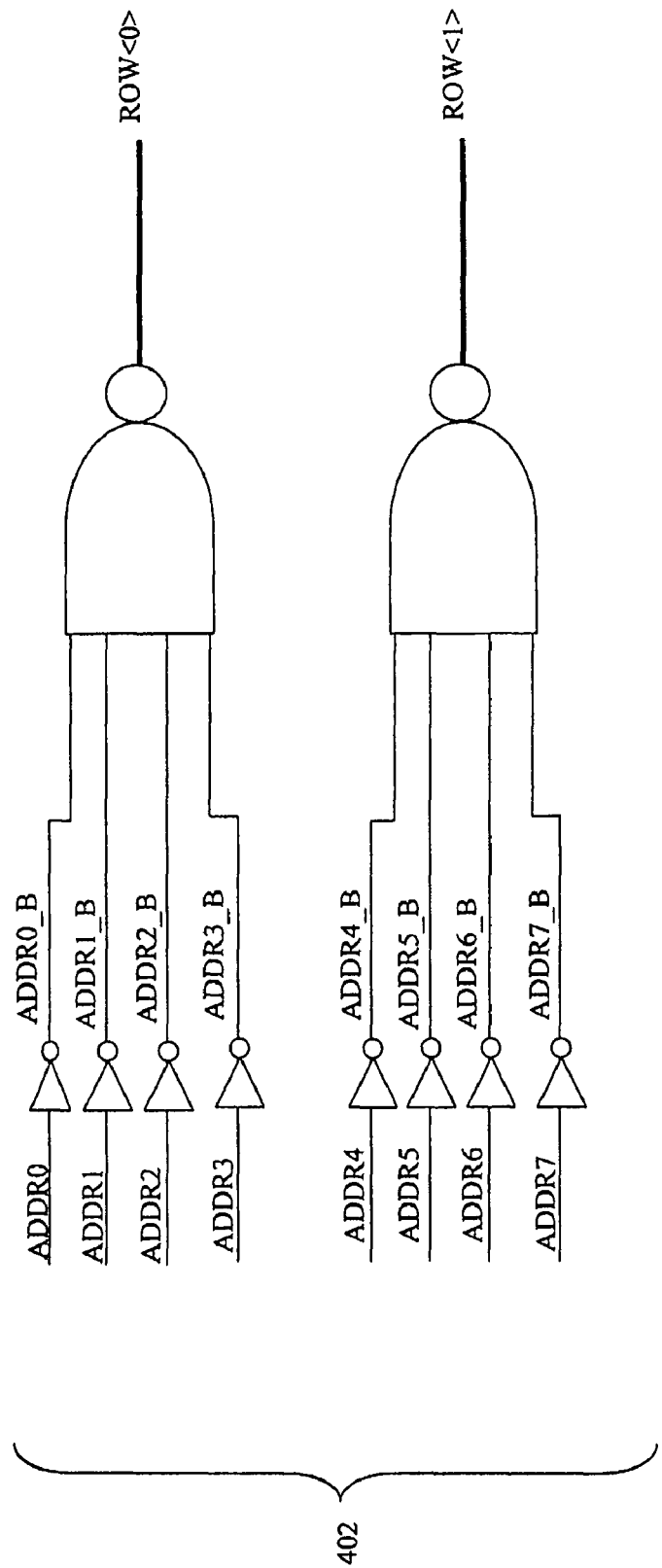
FIG. 6 is a schematic of unshifted-configuration control lines and associated logic circuits for the pixel blocks of FIG. 5B.

Because the pixel blocks 300F-300I of FIG. 5A are not shifted, each four rows of photosensors 102 within a pixel block 300F-300I may be associated with a single readout circuit 201, with all readout circuits 201 arranged in a row 351 of the pixel array. Thus, the readout circuitry 201 for photosensor rows 301-304 may be controlled with one grouped control signal, e.g. ROW<0> (FIG. 6). Accordingly, a simpler row selection logic, shown in FIG. 6, can be used. As FIG. 6 shows, the readout of four rows of photosensors may be controlled by one grouped control signal, e.g. ROW<0>, ROW<1>.

In FIG. 6, output lines 402, carrying signals ADDR0-ADDR7, are the outputs of a row decoder 811 (FIG. 3A). Each signal ADDR0-ADDR7 is inverted to create inverted signals ADDR0_B-ADDR7_B prior to being grouped into signals ROW<0> and ROW<1>. Signal ROW<0> is a logical OR of the signals ADDR0-ADDR3 and signal ROW<1> is a logical OR of the signals ADDR4-ADDR7. If the output lines ADDR0-ADDR3 in FIG. 7 correspond to rows 301-304 in FIG. 6A, ROW<0> may be used to control the readout circuitry 201 (FIG. 5A) of each pixel block 300 during the read out of every photosensor 102 in FIG. 6A. The timing of the control signals used for readout in the unshifted configuration FIGS. 5A, 5B is identical to that shown in FIG. 4, as discussed below.

The timing of control signals shown in FIG. 4 may be used to read out an unshifted configuration pixel block, e.g. 300F. For pixel block 300F in FIG. 5B, control signals TXA-TXD are used to control the operation of transfer gates 104A-104D. The RST control signal is a grouped reset signal used to operate reset transistor gate 106A (FIG. 5B), and the ROW signal is a grouped control signal, e.g. ROW<0> as described above with reference to FIG. 6. Control signals SHR and SHS are used to selectively sample and hold Vrst and Vsig signals from pixel block 300F on sample and hold circuit 801, 803 (FIG. 2D). The readout of photosensor 102 in pixel block 300F is accomplished in an identical manner as the process discussed with reference to FIG. 4 above.

Although embodiments described above illustrated transfer gates 104A-104D which span across photosensors of two pixel blocks, it should be apparent that the transfer gates can span across more than two photosensors of a photosensor row and indeed may span across an entire row of photosensors of an array.

The embodiments described above solve the problem of diminishing pixel fill factor as pixels become smaller through the use of shared readout circuitry and straight gate transfer transistors. Shared readout circuitry allows several pixels to be consolidated into pixel blocks, dividing the space requirements of readout circuitry between four pixels and leaving more space for photosensors. Straight gate transfer gates further increase the efficiency of these embodiments by increasing the rate of charge transfer between photosensors and their associated floating diffusion regions. Because straight gate transfer gates may span any number of photosensors in a row of the pixel array, fabrication of such a pixel may be simplified. Further embodiments comprise fabricating an integrated circuit or a CMOS imaging device on a substrate to have the structures described above with reference to FIGS. 2A-2D, 3A-3B, 5A-5B, and 6.

Figure 7A:
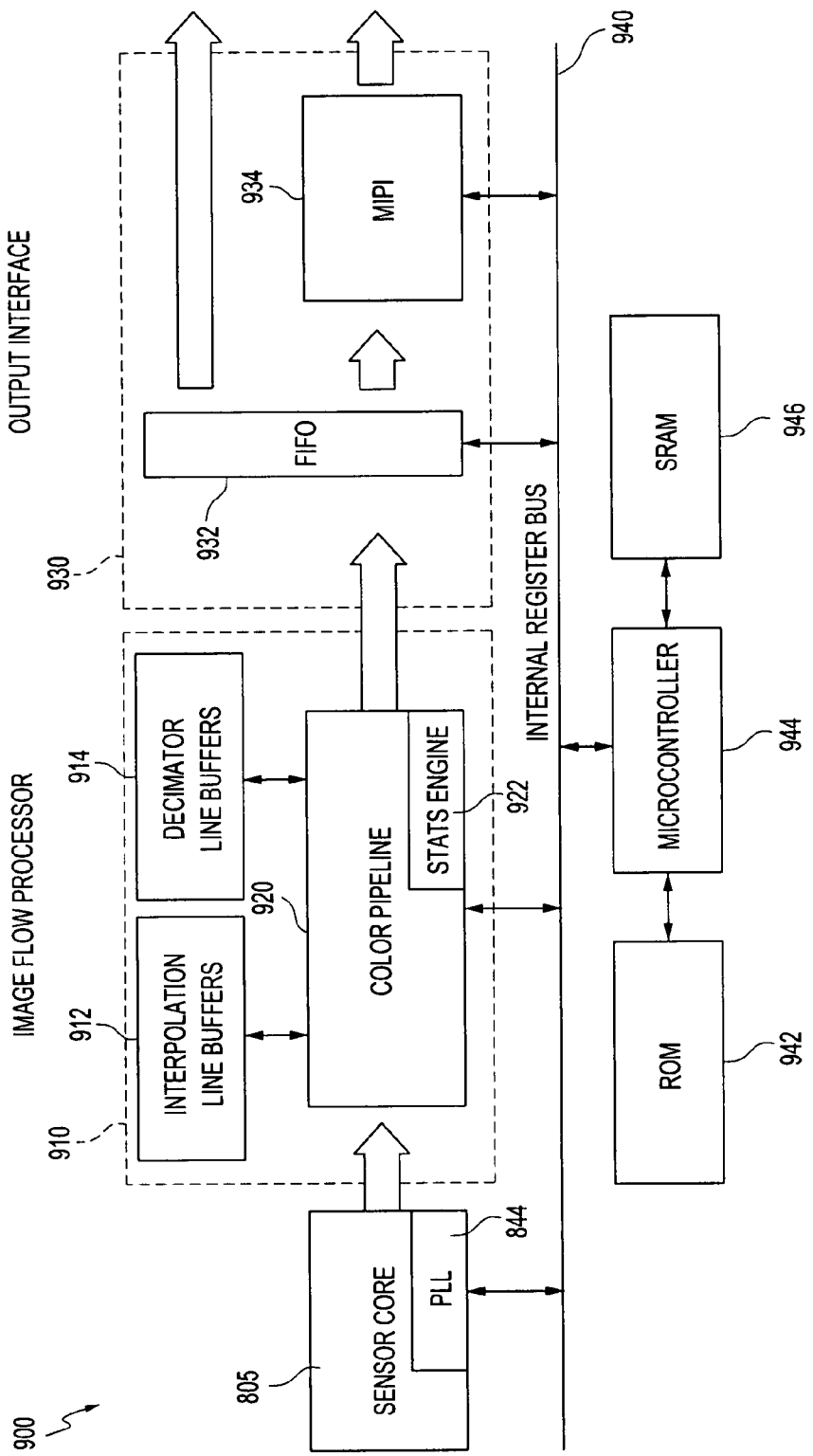
FIG. 7A is a block diagram of system-on-a-chip imaging device constructed in accordance with an embodiment described herein.

FIG. 7A illustrates a block diagram of an exemplary system-on-a-chip (SOC) color imaging device 900 constructed in accordance with an embodiment. In a color imaging device, each photosensor receives photons of a prescribed wavelength range, e.g. red, blue, green, as set by a color filter array provided over the photosensors. The imaging device 900 comprises a sensor core 805, containing a pixel array having photosensors arranged in pixel blocks as described herein, that communicates with an image flow processor 910 that is also connected to an output interface 930. A phase locked loop (PLL) 844 is used as a clock for the sensor core 805. The image flow processor 910, which is responsible for image and color processing, includes associated interpolation line buffers 912, decimator line buffers 914, and a color pipeline 920. The color pipeline 920 includes, among other things, a statistics engine 922 for providing image statistics. The output interface 930 includes an output first-in-first-out (FIFO) parallel output 932 and a serial Mobile Industry Processing Interface (MIPI) output 934. The user can select either a serial output or a parallel output by setting registers within the chip. An internal register bus 940 connects read only memory (ROM) 942, a microcontroller 944 and a static random access memory (SRAM) 946 to the sensor core 805, image flow processor 910 and the output interface 930.

Figure 7B:
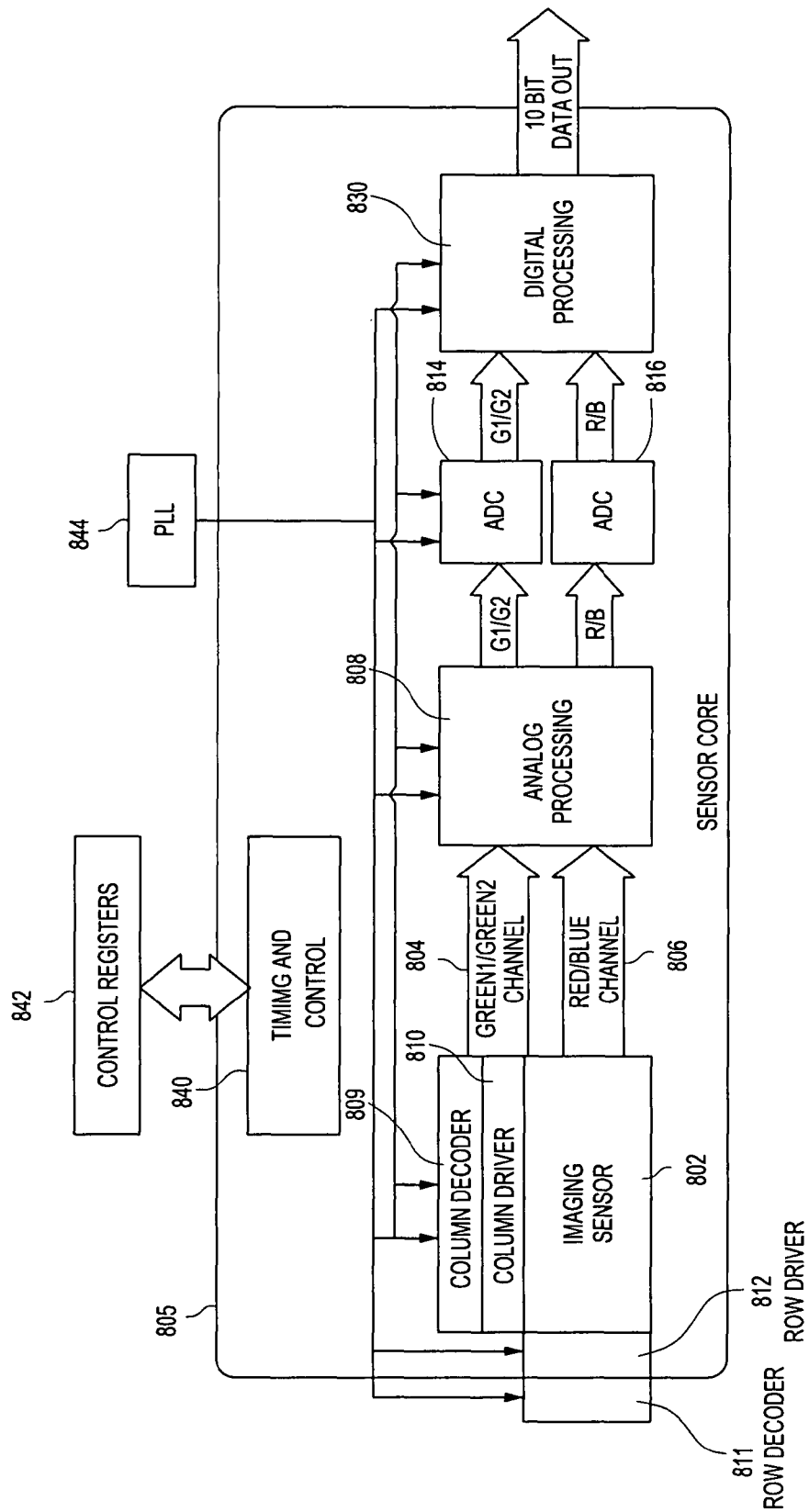
FIG. 7B illustrates an example of a sensor core used in the FIG. 8A device.

FIG. 7B illustrates a sensor core 805 which may be used in the FIG. 8A imaging device 900. The sensor core 805 includes an imaging sensor 802, containing a pixel array as described herein, which is connected to analog processing circuitry 808, including the sample and hold circuit 801 and differential amplifier 803 described above and associated analog signal amplifier, by a greenred/greenblue channel 804 and a red/blue channel 806. Although only two channels 804, 806 are illustrated, there are effectively two green channels, one red channel, and one blue channel, for a total of four channels. The greenred (i.e., Green1) and greenblue (i.e., Green2) signals are readout at different times (using channel 804) and the red and blue signals are readout at different times (using channel 806). The analog processing circuitry 808 outputs processed greenred/greenblue signals G1/G2 to a first analog-to-digital converter (ADC) 814 and processed red/blue signals R/B to a second analog-to-digital converter 816. The outputs of the two analog-to-digital converters 814, 816 are sent to a digital processor 830, the output of which goes to the image flow processor 910.

Connected to, or as part of, the imaging sensor 802 are row and column decoders 811, 809 and row and column driver circuitry 812, 810 that are controlled by a timing and control circuit 840. The timing and control circuit 840 uses control registers 842 to determine how the imaging sensor 802 and other components are controlled, for example, controlling the mode of operation of the imaging sensor 802 (e.g., global reset mode or electronic rolling shutter). As set forth above, the PLL 844 serves as a clock for the components in the core 805. The imaging sensor 802 comprises a plurality of pixel circuits as described herein. In operation, the pixel circuits of each row in imaging sensor 802 are all turned on at the same time by a row select line, such as shown in FIG. 3B and FIG. 6, and the pixel circuits of each column are selectively output onto column output lines by a column select line. A plurality of column lines are provided for the entire imaging sensor 802. The row lines are selectively activated by row driver circuitry 812 in response to the row address decoder 811 and the column select lines are selectively activated by a column driver 810 in response to the column address decoder 809. The timing and control circuit 840 controls the address decoders 811, 809 for selecting the appropriate row and column lines for pixel readout, and the row and column driver circuitry 812, 810, which apply driving voltage to the drive transistors of the selected row and column lines.

Each column is connectable to a sampling and holding circuit 801 in the analog processing circuit 808 that read a pixel reset signal Vrst and a pixel image signal Vsig for selected pixel circuits. Because the core 805 uses greenred/greenblue channel 804 and a separate red/blue channel 806, circuitry 808 will have the capacity to sample and store Vrst and Vsig signals for greenred, greenblue, red, and blue pixel signals. A differential signal (Vrst−Vsig) is produced by differential amplifiers contained in the circuitry 808 for each pixel. Thus, the signals G1/G2 and R/B are signals that are then digitized by a respective analog-to-digital converter 814,

816. The analog-to-digital converters 814, 816 supplies digitized G1/G2, R/B pixel signals to the digital processor 830, which forms a digital image output (e.g., a 10-bit digital output). As noted, the digital processor 830 performs pixel processing operations. The output is sent to the image flow processor 910 (FIG. 8A).

Although the sensor core 805 has been described with reference to use with a CMOS imaging sensor having the pixel blocks described herein, this is merely one example sensor core that may be used. While the imaging device 900 (FIG. 7A) has been shown as a system-on-a-chip, it should be appreciated that the embodiments are not so limited. Other imaging devices, such as, for example, a stand-alone sensor core 805 coupled to a separate signal processing chip could be used in accordance with the embodiments.

Figure 8:
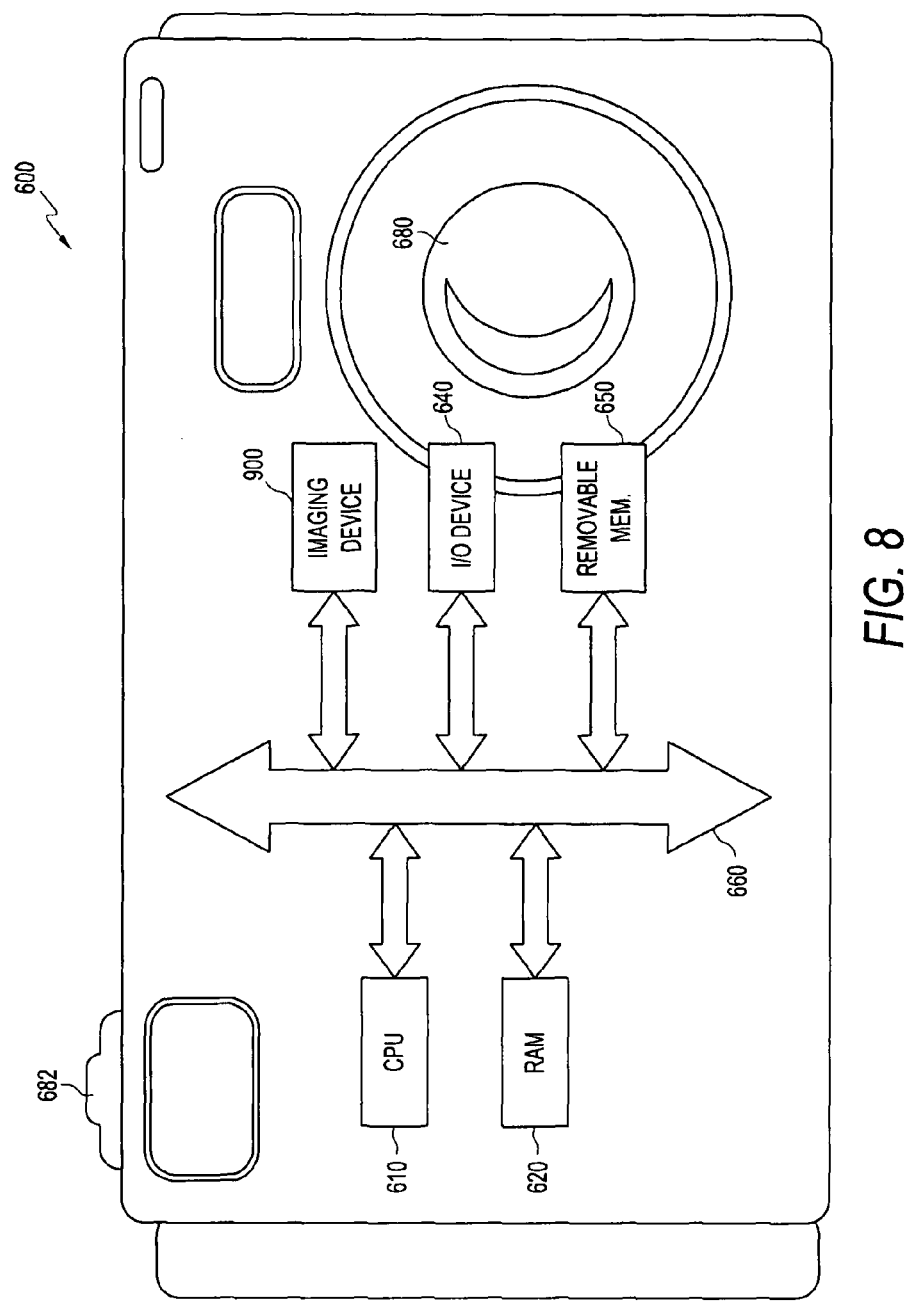
FIG. 8 illustrates a system incorporating at least one imaging device in accordance with an embodiment described herein.

FIG. 8 shows a typical imaging system 600, such as, for example, a camera. The system 600 is an example of a system having digital circuits that may include an imaging device 900. Without being limiting, such a system could include a computer system, camera system (such as a digital still camera, digital single-lens reflex camera, or digital video camera), scanner, machine vision, vehicle navigation system, video phone, surveillance system, auto focus system, star tracker system, motion detection system, image stabilization system, and other systems employing an imaging device 900.

System 600, for example, a camera system, includes a lens 680 for focusing an image on the imaging device 900 when a shutter release button 682 is pressed. System 600 generally comprises a central processing unit (CPU) 610, such as a microprocessor that controls camera functions and image flow, and communicates with one or more input/output (I/O) devices 640 over a bus 660. The imaging device 900 also communicates with the CPU 610 over the bus 660. The system 600 also includes random access memory (RAM) 620, and can include removable memory 650, such as flash memory, which also communicates with the CPU 610 over the bus 660. The imaging device 900 may be combined with the CPU 610, with or without memory storage on a single integrated circuit, such as, for example, a system-on-a-chip, or on a different chip than the CPU 610. As described above, image data from the imaging sensor 802 (FIG. 8B) can be output from the imaging device 900 and stored, for example in the random access memory 620, on a removable memory 650, or in the CPU 610.

While the embodiments have been described in detail in connection with embodiments known at the time, it should be readily understood that the claimed invention is not limited to the disclosed embodiments. Rather, the embodiments can be modified to incorporate any number of variations, alterations, substitutions, or equivalent arrangements not heretofore described. For example, while the embodiments are described in connection with a CMOS imaging sensor, they can be practiced with other types of imaging sensors. In addition, other arrangements of pixel blocks having a straight transfer gate architecture may be envisioned. Additionally, three or five channels, or any number of color channels may be used, rather than four, for example, and they may comprise additional or different colors/channels than greenred, red, blue, and greenblue, such as e.g., cyan, magenta, yellow (CMY); cyan, magenta, yellow, black (CMYK); or red, green, blue, indigo (RGBI) or other color combinations. Accordingly, the invention is not limited by the foregoing description, but is only limited by the scope of the claims appended hereto.

What is claimed as new and desired to be protected by Letters Patent of the United States is:

1. A pixel array comprising:
   a plurality of pixel blocks arranged in rows and columns, each pixel block comprising:
   a plurality of adjacent photosensors within a column of photosensors of the array for generating photocharges;
   a shared storage node for storing photocharges from said plurality of photosensors;
   a shared readout circuit connected to said storage node; and
   a plurality of rectilinear straight transfer gates respectively associated with the photosensors for selectively transferring photocharges from an associated photosensor to the storage node, wherein, in each pixel block, each of the transfer gates are approximately parallel to each other.

2. The pixel array of claim 1, wherein each of the transfer gates is oriented parallel to an edge of a respective photosensor.

3. The pixel array of claim 1, wherein the transfer gates extend linearly in a direction of rows of photosensors of the array.

4. The pixel array of claim 1, wherein the shared readout circuit further comprises a reset transistor for resetting the charges stored at the common storage node, a common source follower transistor having a gate connected to said shared storage node, and a row select transistor for gating the output of said source follower transistor.

5. The pixel array of claim 4, wherein said plurality of photosensors define a plurality of adjacent pixels in a column of the array.

6. The pixel array of claim 5, wherein said plurality of photosensors equals four photosensors.

7. The pixel array of claim 5, wherein the shared readout circuit is at least partially located between two of the plurality of photosensors and extends into an adjacent column of photosensors of the array.

8. The pixel array of claim 7,
   wherein two of the plurality of photosensors are located above the shared readout circuit, and
   wherein another two of the plurality of photosensors are located below the shared readout circuit.

9. The pixel array of claim 7, wherein the plurality of photosensors in each block are disposed in four contiguous photosensor rows, and each row-wise adjacent block comprises photosensors in the same four rows as adjacent blocks having photosensors in adjacent columns.

10. The pixel array of claim 1, wherein at least one transfer gate of a pixel block is further connected to a photosensor in a different pixel block.

11. The pixel array of claim 10, wherein said at least one transfer gate is connected to at least two photosensors in a same photosensor row of said array.

12. The pixel array of claim 10, wherein said at least one transfer gate is connected to more than two photosensors in a same photosensor row of said array.

13. The pixel array of claim 10, wherein said at least one transfer gate is connected to each photosensor in a same photosensor row of said array.

14. The pixel array of claim 1, wherein each pixel block is ninety-degree rotated T shape.

15. The pixel array of claim 1, wherein each pixel block has a generally rectilinear shape.

16. The pixel array of claim 13, wherein the photosensors of a first pixel block are located in a first column of photosensors of said array and the photosensors of a second pixel block are located in a second column of photosensors of said array adjacent the first column of photosensors, and said first pixel block is offset by a plurality of rows of photosensors from said second pixel block.

17. The pixel array of claim 16, wherein said offset is two rows of photosensors.

18. The pixel array of claim 14, wherein the photosensors of a first pixel block are located in a first column of photosensors of said array and the photosensors of a second pixel block are located in a second column of photosensors of said array adjacent the first column of photosensors, and the photosensors of said first block are located in the same rows of photosensors as the photosensors of said second block.

19. The pixel array of claim 1, wherein a portion of a first readout circuit in a first pixel block is shared by a second readout circuit in a second pixel block row-wise adjacent the first pixel block.

20. A pixel array comprising:
A plurality of photosensors arranged in rows of photosensors and columns of photosensors and grouped into at least first and second pixel blocks, each of said first and second pixel blocks comprising a plurality of photosensors arranged in a single column of photosensors and a common readout circuit for said plurality of photosensors,
photosensors of said first pixel block being offset from the photosensors of said second pixel block by one column of photosensors and by a plurality of rows of photosensors.

21. The pixel array of claim 20, wherein the plurality of rows of photosensors is two rows of photosensors.

22. The pixel array of claim 20, wherein each of said first and second pixel blocks further comprises a transfer gate respectively provided at an edge of each photosensor.

23. The pixel array of claim 22, wherein a longer dimension of said transfer gate extends in the direction of a row of photosensors of said array.

24. An imager device comprising:
an array of pixels comprising a plurality of photosensors arranged in rows of photosensors and columns of photosensors and grouped into pixel blocks, each block comprising:
first, second, third, and fourth photosensors located in a same column of photosensors for generating photocharges in response to applied light;
a common storage node for receiving said photocharges from said photosensors;
first, second, third, and fourth transfer gates for respectively transferring photocharges from said first, second, third, and fourth photosensors to said common storage node; and
a first transistor for producing at least one signal representing an amount of charge stored at said storage node;
a second transistor for resetting the storage node; and
a third transistor for selectively connecting said second transistor to a column line of said array;
wherein said first, second, third, and fourth transfer gates have a rectangular shape and extend along an edge of a respective photosensor, wherein, in each pixel block, said first, second, third and fourth transfer gates of that pixel block has a first side with a first dimension and a second side with a second dimension that is shorter than the first dimension and wherein, in each pixel block, the first sides of said first, second, third and fourth transfer gates of that pixel block are approximately parallel to each other.

25. The imager device of claim 24, wherein said first, second, and third transistors form part of a pixel block readout circuit which extends across two columns of photosensors of said array.

26. The imager device of claim 24, wherein each of said transfer gates of a first pixel block extends to and is a transfer gate for a photosensor in a second pixel block.

27. The imager device of claim 24, wherein each of said transfer gates of a first pixel block extends to and is a transfer gate for at least one other photosensor in a same row of photosensors of the array as its respective photosensor.

28. The imager device of claim 24, wherein each of said transfer gates of a first pixel block extends to and is a transfer gate for each photosensor in a same row of photosensors of the array as its respective photosensor.

29. The imager device of claim 24, wherein each pixel block is associated with an adjacent pixel block to form a unit cell, and wherein each unit cell is substantially identical.

30. The imager device of claim 24, wherein a first pixel block is offset from a second pixel block by two array rows of photosensors.

31. The imager device of claim 24, further comprising:
a circuit for operating said pixel blocks such that readout circuits in respective pixel blocks having photosensors in a same row of said array are operated at the same time for pixel signal readout.

32. The imager of claim 31,
wherein the circuit provides first and second control signals,
wherein the first control signal is used to control the pixel signal readout of photosensors in the even columns of the row; and
wherein the second control signal is used to control the pixel signal readout of photosensors in the odd columns of the row.

33. The imager of claim 32, wherein photosensors in a row and in two adjacent columns are respectively associated with row selection circuits of said first and second pixel blocks.

34. The imager device of claim 24, wherein:
the first, second, third, and fourth photosensors of a first pixel block are each within a respective one of a first, second, third, and fourth row of photosensors; and
the first, second, third, and fourth photosensors of a second pixel block are each within a respective one of the first, second, third, and fourth row of photosensors;
wherein the photosensors of the first pixel block are each within a first column of the array and the photosensors of the second pixel blocks are each within a second column of the array adjacent the first column.

35. The imager device of claim 24, wherein:
the first, second, third, and fourth photosensors of a first pixel block are each within a respective one of a first, second, third, and fourth row of photosensors;
the first and second photosensors of a second pixel block are each within a respective one of the third and fourth row of photosensors; and
the third, and fourth photosensors of the second pixel block are each within a respective one of a fifth and sixth row of photosensors;
wherein the photosensors of the first pixel block are each within a first column of the array and the photosensors of the second pixel blocks are each within a second column of the array adjacent the first column.

36. The imager device of claim 24, wherein said imager device is part of a camera system, said camera system comprising a lens structure for focusing an image on said pixel array.

37. The imager device of claim 24 wherein said first, second, and third transistors form part of a readout circuit for said block, and wherein first and second pixel blocks are offset from one another by a plurality of rows of photosensors, with each of said first and second blocks having a first photosensor in a same row of photosensors of said array, said imager device further comprising:
 a decoding circuit for decoding pixel row addresses and for providing activating signals for the readout circuits of said first and second pixel blocks so that the first photosensors can be read out at the same time.

* * * * *